United States Patent
Yuan et al.

(10) Patent No.: US 10,811,114 B2
(45) Date of Patent: Oct. 20, 2020

(54) SHIFT REGISTER UNIT AND METHOD FOR DRIVING THE SAME, GATE DRIVING CIRCUIT, AND DISPLAY APPARATUS

(71) Applicant: BOE Technology Group Co., Ltd., Beijing (CN)

(72) Inventors: Lijun Yuan, Beijing (CN); Mingfu Han, Beijing (CN); Seung Woo Han, Beijing (CN); Xing Yao, Beijing (CN); Zhichong Wang, Beijing (CN); Guangliang Shang, Beijing (CN); Haoliang Zheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 126 days.

(21) Appl. No.: 16/138,878

(22) Filed: Sep. 21, 2018

(65) Prior Publication Data
US 2019/0180834 A1    Jun. 13, 2019

(30) Foreign Application Priority Data
Dec. 11, 2017 (CN) .......................... 2017 1 1315757

(51) Int. Cl.
| | | |
|---|---|---|
| G11C 19/00 | (2006.01) | |
| G11C 19/28 | (2006.01) | |
| G09G 3/3258 | (2016.01) | |
| G09G 3/36 | (2006.01) | |

(52) U.S. Cl.
CPC ......... *G11C 19/287* (2013.01); *G09G 3/3258* (2013.01); *G09G 3/3677* (2013.01); *G11C 19/28* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

| | | | | |
|---|---|---|---|---|
| 9,318,055 | B2* | 4/2016 | Kim | G09G 3/3266 |
| 9,437,151 | B2* | 9/2016 | Guo | G09G 3/3677 |
| 10,013,941 | B2* | 7/2018 | Wang | G02B 30/00 |
| 10,152,939 | B2* | 12/2018 | Liu | G09G 3/3677 |
| 10,431,144 | B2* | 10/2019 | Wang | G09G 3/3677 |
| 2002/0080108 | A1* | 6/2002 | Wang | G09G 3/3677 |
| | | | | 345/90 |

(Continued)

*Primary Examiner* — Tuan T Lam
(74) *Attorney, Agent, or Firm* — McDermott Will & Emery LLP

(57) ABSTRACT

Embodiments of the present application provide a shift register unit, a method for driving the same, a gate driving circuit, and a display apparatus. The shift register unit comprises at least two sub-circuits of a first output sub-circuit, a second output sub-circuit, and a third output sub-circuit. The first output sub-circuit is configured to output a voltage at a signal output terminal to a reset signal output terminal; the second output sub-circuit is configured to output the voltage at the signal output terminal to a gating signal output terminal; and the third output sub-circuit is configured to output a voltage at a second voltage terminal to a light-emitting control signal output terminal or is configured to output a voltage at a first voltage terminal to the light-emitting control signal output terminal.

18 Claims, 9 Drawing Sheets

(56) References Cited

U.S. PATENT DOCUMENTS

| | | | |
|---|---|---|---|
| 2005/0264551 A1* | 12/2005 | Hsieh | G09G 3/20 345/204 |
| 2006/0267909 A1* | 11/2006 | Hsu | G09G 3/3677 345/100 |
| 2008/0211744 A1* | 9/2008 | Lee | G09G 3/3208 345/76 |
| 2008/0316159 A1* | 12/2008 | Qi | G09G 3/3677 345/92 |
| 2009/0040168 A1* | 2/2009 | Liu | G09G 3/3677 345/100 |
| 2009/0079669 A1* | 3/2009 | Huang | G09G 3/3677 345/30 |
| 2016/0105184 A1* | 4/2016 | Qian | H03K 19/0944 345/214 |
| 2016/0148556 A1* | 5/2016 | Tseng | G09G 3/3677 345/55 |
| 2017/0004775 A1* | 1/2017 | Chen | G09G 3/3266 |
| 2017/0186360 A1* | 6/2017 | Ma | G11C 19/28 |
| 2017/0287423 A1* | 10/2017 | Yang | G09G 3/3688 |
| 2019/0164497 A1* | 5/2019 | Wang | G11C 19/28 |

* cited by examiner

SHIFT REGISTER UNIT AND METHOD FOR DRIVING THE SAME, GATE DRIVING CIRCUIT, AND DISPLAY APPARATUS

CROSS-REFERENCE TO RELATED APPLICATION(S)

This application claims priority to the Chinese Patent Application No. 201711315757.X, filed on Dec. 11, 2017, entitled "SHIFT REGISTER UNIT AND METHOD FOR DRIVING THE SAME, GATE DRIVING CIRCUIT, AND DISPLAY APPARATUS", which is incorporated herein by reference in its entirety.

TECHNICAL FIELD

The present disclosure relates to the field of display technologies, and more particularly, to a shift register unit and a method for driving the same, a gate driving circuit, and a display apparatus.

BACKGROUND

With the rapid progress of display technology, the semiconductor element technology, which is the core of display apparatuses, has also made great progress. For a display apparatus, an Organic Light-Emitting Diode (OLED), which is a current-type light-emitting device, is more or more applied in the field of high performance display because of its characteristics such as self-illumination, a rapid response, a wide viewing angle, and a capability to be manufactured on a flexible substrate etc.

A pixel circuit is provided in a sub-pixel of an OLED display apparatus, and has a plurality of different signal terminals. In the related art, for each signal terminal of the pixel circuit, it is necessary to provide a driving circuit coupled to the signal terminal in a non-display area, and the driving circuit is configured to supply a corresponding voltage to the signal terminal coupled thereto. However, this may cause a plurality of different driving circuits to occupy a large wiring space, which is disadvantageous for a narrow bezel design.

SUMMARY

Embodiments of the present disclosure provide a shift register unit and a method for driving the same, a gate driving circuit, and a display apparatus.

According to an aspect of the embodiments of the present application, there is provided a shift register unit comprising: at least two sub-circuits of a first output sub-circuit, a second output sub-circuit, and a third output sub-circuit, wherein the shift register unit further comprises a front-end circuit, wherein the front-end circuit is coupled to a signal input terminal, a first clock signal terminal, a second clock signal terminal, a first voltage terminal, a second voltage terminal, and a signal output terminal, and is configured to receive a voltage at the signal input terminal, and output a voltage at the second clock signal terminal or a voltage at the second voltage terminal to the signal output terminal under the control of the first clock signal terminal and the second clock signal terminal; the first output sub-circuit is coupled to a third clock signal terminal, the second voltage terminal, the signal output terminal, a reset signal output terminal, and a gating signal output terminal, and is configured to output a voltage at the signal output terminal to the reset signal output terminal and output the voltage at the second voltage terminal to the gating signal output terminal under the control of the third clock signal terminal; the second output sub-circuit is coupled to a fourth clock signal terminal, the second voltage terminal, the signal output terminal, the reset signal output terminal, and the gating signal output terminal, and is configured to output the voltage at the signal output terminal to the gating signal output terminal and output the voltage at the second voltage terminal to the reset signal output terminal under the control of the fourth clock signal terminal; and the third output sub-circuit is coupled to the first voltage terminal, the signal output terminal, the second voltage terminal, and a light-emitting control signal output terminal, and is configured to output the voltage at the second voltage terminal to the light-emitting control signal output terminal under the control of the signal output terminal, or is configured to output a voltage at the first voltage terminal to the light-emitting control signal output terminal under the control of the first voltage terminal.

Optionally, the first output sub-circuit comprises a first transistor and a second transistor, wherein the first transistor has a gate coupled to the third clock signal terminal, a first electrode coupled to the signal output terminal, and a second electrode coupled to the reset signal output terminal; and the second transistor has a gate coupled to the third clock signal terminal, a first electrode coupled to the gating signal output terminal, and a second electrode coupled to the second voltage terminal.

Optionally, the second output sub-circuit comprises a third transistor and a fourth transistor, wherein the third transistor has a gate coupled to the fourth clock signal terminal, a first electrode coupled to the signal output terminal, and a second electrode coupled to the gating signal output terminal; and the fourth transistor has a gate coupled to the fourth clock signal terminal, a first electrode coupled to the reset signal output terminal, and a second electrode coupled to the second voltage terminal.

Optionally, the third output sub-circuit comprises a thirteenth transistor and a fourteenth transistor, wherein the thirteenth transistor has a gate and a first electrode coupled to the first voltage terminal, and a second electrode coupled to the light-emitting control signal output terminal; and the fourteenth transistor has a gate coupled to the signal output terminal, a first electrode coupled to the light-emitting control signal output terminal, and a second electrode coupled to the second voltage terminal, wherein the fourteenth transistor has a width to length ratio greater than that of the thirteenth transistor.

Optionally, the front-end circuit comprises a pull-up control sub-circuit, a pull-down control sub-circuit, a pull-up sub-circuit, and a pull-down sub-circuit, wherein the pull-up control sub-circuit is coupled to the signal input terminal, the first clock signal terminal, and a pull-up node, and is configured to output the voltage at the signal input terminal output to the pull-up node under the control of the first clock signal terminal; the pull-up sub-circuit is coupled to the second clock signal terminal, the pull-up node, and the signal output terminal, and is configured to output the voltage at the second clock signal terminal to the signal output terminal under the control of the pull-up node; the pull-down control sub-circuit is coupled to the first clock signal terminal, the first voltage terminal, the pull-up node, and a pull-down node, and is configured to transfer voltages at the first voltage terminal and the first clock signal terminal to the pull-down node under the control of the first clock signal terminal and the pull-up node; and the pull-down sub-circuit is coupled to the pull-down node, the second voltage terminal, and the signal output terminal, and is configured to transfer the voltage at the second voltage terminal to the signal output terminal under the control of the pull-down node.

Optionally, the pull-up control sub-circuit comprises a fifth transistor, wherein the fifth transistor has a gate coupled to the first clock signal terminal, a first electrode coupled to the signal input terminal, and a second electrode coupled to the pull-up node.

Optionally, the pull-up control sub-circuit is further coupled to the first voltage terminal, and the pull-up control sub-circuit further comprises a sixth transistor, wherein the sixth transistor has a gate coupled to the first voltage terminal, a first electrode coupled to the second electrode of the fifth transistor, and a second electrode coupled to the pull-up node.

Optionally, the shift register unit further comprises a voltage holding sub-circuit, wherein the voltage holding sub-circuit is coupled to the pull-down node, the second electrode of the fifth transistor, the second clock signal terminal, and the second voltage terminal, and is configured to store the voltage output at the second voltage terminal and output the stored voltage to the second electrode of the fifth transistor under the control of the second clock signal terminal and the pull-down node.

Optionally, the voltage holding sub-circuit comprises a seventh transistor and an eighth transistor, wherein the seventh transistor has a gate coupled to the second clock signal terminal, a first electrode coupled to the second electrode of the fifth transistor, and a second electrode coupled to a first electrode of the eighth transistor; and the eighth transistor has a gate coupled to the pull-down node, and a second electrode coupled to the second voltage terminal.

Optionally, the pull-down control sub-circuit comprises a ninth transistor and a tenth transistor, wherein the ninth transistor has a gate coupled to the first clock signal terminal, a first electrode coupled to the first voltage terminal, and a second electrode coupled to the pull-down node; and the tenth transistor has a gate coupled to the pull-up node, a first electrode coupled to the first clock signal terminal, and a second electrode coupled to the pull-down node.

Optionally, the pull-up sub-circuit comprises an eleventh transistor and a first capacitor, wherein the eleventh transistor has a gate coupled to the pull-up node, a first electrode coupled to the second clock signal terminal, and a second electrode coupled to the signal output terminal; and the first capacitor has one terminal coupled to the gate of the eleventh transistor, and the other terminal coupled to the second electrode of the eleventh transistor.

Optionally, the pull-down sub-circuit comprises a twelfth transistor and a second capacitor, wherein the twelfth transistor has a gate coupled to the pull-down node, a first electrode coupled to the signal output terminal, and a second electrode coupled to the second voltage terminal; and the second capacitor has one terminal coupled to the gate of the twelfth transistor, and the other terminal coupled to the second electrode of the twelfth transistor.

According to another aspect of the embodiments of the present application, there is provided a gate driving circuit comprising a plurality of cascaded shift register units, each of which is any shift register unit described above, wherein the signal input terminal of the shift register unit at the first stage is coupled to a start signal terminal; and for other shift register units than the shift register unit at the first stage, the signal output terminal of the shift register unit at a stage is coupled to the signal input terminal of the shift register unit at the next stage.

According to a further aspect of the embodiments of the present application, there is provided a display apparatus, comprising the gate driving circuit described above.

According to yet another aspect of the embodiments of the present application, there is provided a method for driving any shift register unit described above, wherein in a case where the front-end circuit of the shift register unit comprises a pull-up control sub-circuit, a pull-down control sub-circuit, a pull-up sub-circuit, and a pull-down sub-circuit, the method comprises, in one frame of image: in a first phase and a second phase, outputting, by the pull-up control sub-circuit, a voltage at the signal input terminal to the pull-up node under the control of the first clock signal terminal; outputting, by the pull-up sub-circuit, a voltage at the second clock signal terminal to the signal output terminal under the control of the pull-up node; transferring, by the pull-down control sub-circuit, voltages at the first voltage terminal and the first clock signal terminal to the pull-down node under the control of the first clock signal terminal and the pull-up node; transferring, by the pull-down sub-circuit, a voltage at the second voltage terminal to the signal output terminal under the control of the pull-down node; and outputting, by the third output sub-circuit, a voltage at the first voltage terminal to the light-emitting control signal output terminal under the control of the first voltage terminal; in a third phase and a fourth phase, outputting, by the pull-up sub-circuit, the voltage at the second clock signal terminal to the signal output terminal under the control of the pull-up node; transferring, by the pull-down control sub-circuit, a voltage at the first clock signal terminal to the pull-down node under the control of the pull-up node; entering, by the pull-down sub-circuit, a turn-off state under the control of the pull-down node; and outputting, by the third output sub-circuit, the voltage at the second voltage terminal to the light-emitting control signal output terminal under the control of the signal output terminal; and in the first phase and the third phase, outputting, by the first output sub-circuit, a voltage at the signal output terminal to the reset signal output terminal and outputting the voltage at the second voltage terminal to the gating signal output terminal under the control of the third clock signal terminal; in the second phase and the fourth phase, outputting, by the second output sub-circuit, the voltage at the signal output terminal to the gating signal output terminal and outputting the voltage at the second voltage terminal to the reset signal output terminal under the control of the fourth clock signal terminal; and in a fifth phase, transferring, by the pull-down control sub-circuit, the voltage at the first voltage terminal to the pull-down node under the control of the first clock signal terminal, and transferring, by the pull-down sub-circuit, the voltage at the second voltage terminal to the signal output terminal under the control of the pull-down node; in a sixth phase, continuously transferring, by the pull-down sub-circuit, the voltage at the second voltage terminal to the signal output terminal; and in the fifth phase and the sixth phase, alternately outputting, by the first output sub-circuit and the second output sub-circuit, the voltage at the signal output terminal to the reset signal output terminal and the gating signal output terminal respectively; and outputting, by the third output sub-circuit, the voltage at the first voltage terminal to the light-emitting control signal output terminal under the control of the first voltage terminal.

Optionally, the method further comprises: repeating the fifth phase and the sixth phase after the sixth phase until the start of a next frame of image, wherein the first phase, the second phase, the third phase, and the fourth phase have the same duration, and the fifth phase and the sixth phase have duration twice the duration of the fourth phase.

Optionally, in a case where the pull-up control sub-circuit comprises a voltage holding sub-circuit, the method comprises: in the fifth phase, storing, by the voltage holding sub-circuit, the voltage output at the second voltage terminal under the control of the second clock signal terminal and the pull-down node; and in the sixth phase, outputting, by the voltage holding sub-circuit, the stored voltage to the pull-up node under the control of the second clock signal terminal and the pull-down node.

Optionally, signals output at the first clock signal terminal and the second clock signal terminal have the same frequency and opposite phases; signals output at the third clock signal terminal and the fourth clock signal terminal have the same frequency and opposite phases; and a frequency of the signal output at the first clock signal terminal is ½ of a frequency of the signal output at the third clock signal terminal.

BRIEF DESCRIPTION OF THE DRAWINGS

In order to more clearly illustrate the technical solutions in the embodiments of the present disclosure or the related art, the accompanying drawings to be used in the description of the embodiments or the related art will be briefly described below. Obviously, the accompanying drawings in the following description are only some of the embodiments of the present disclosure, and other accompanying drawings may further be obtained by those of ordinary skill in the art according to these accompanying drawings without any creative work.

FIG. 3b is a timing diagram of some of signal terminals in FIG. 3a;

DETAILED DESCRIPTION

The technical solutions in the embodiments of the present disclosure will be described clearly and completely below with reference to the accompanying drawings in the embodiments of the present disclosure. It is obvious that the described embodiments are only some of the embodiments of the present disclosure, instead of all the embodiments. All other embodiments obtained by those of ordinary skill in the art based on the embodiments of the present disclosure without any creative work fall within the protection scope of the present disclosure.

In the following, the terms "first" and "second" are used for descriptive purposes only, and are not to be construed as indicating or implying a relative importance or implicitly indicating a number of technical features indicated. Thus, features defined with "first" and "second" may explicitly or implicitly comprise one or more such features. In the description of the embodiments of the present application, "multiple" means two or more unless otherwise stated.

Figure 1:
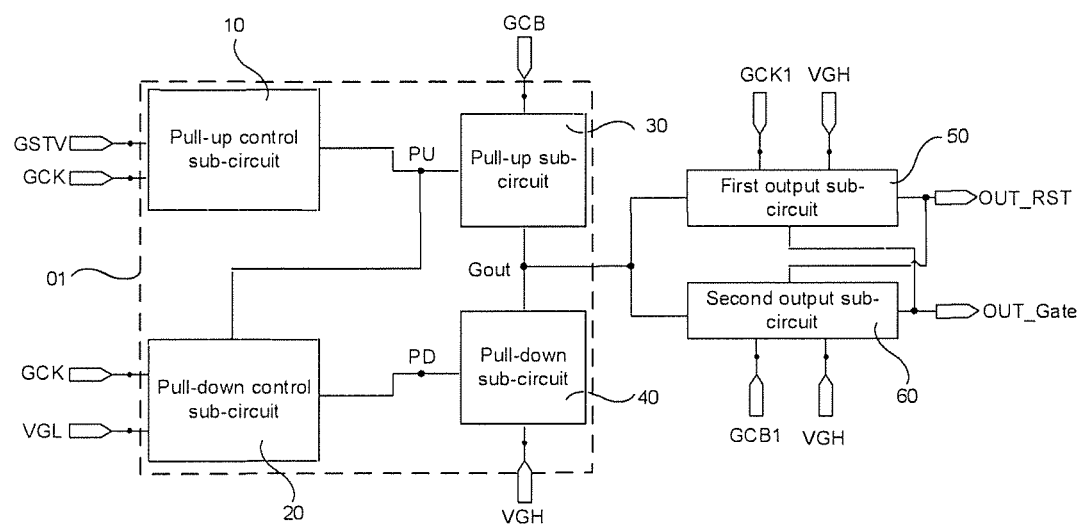
FIG. 1 is an exemplary structural diagram of a shift register unit according to an embodiment of the present application.
Figure 2:
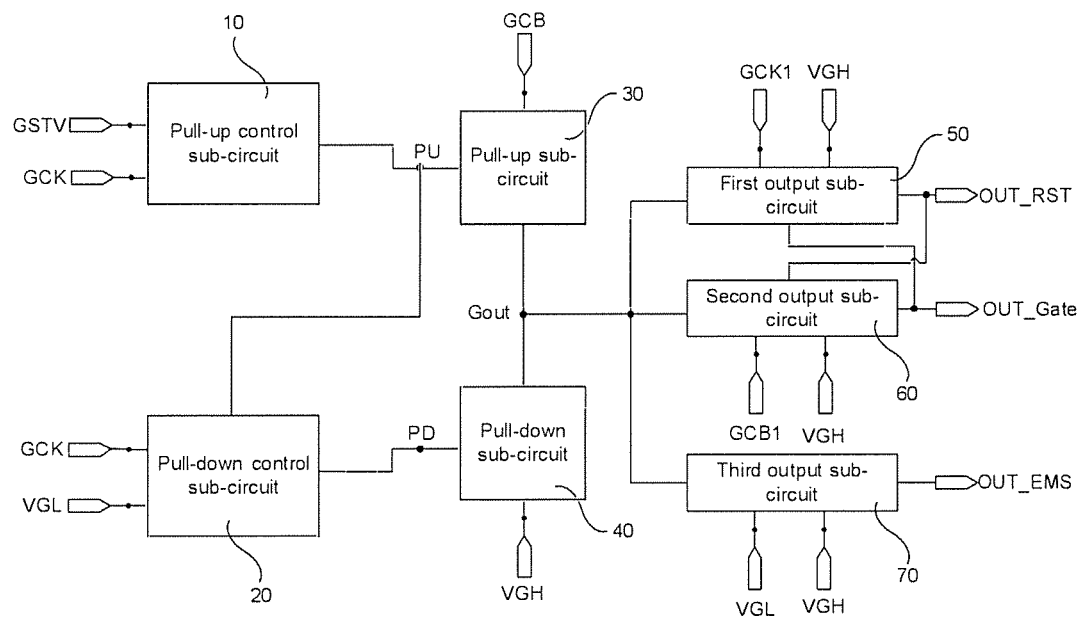
FIG. 2 is an exemplary structural diagram of another shift register unit according to an embodiment of the present application.

The embodiments of the present application provide a shift register unit, as shown in FIGS. 1 and 2, comprising at least two sub-circuits of a first output sub-circuit 50, a second output sub-circuit 60, and a third output sub-circuit 70. Specifically, for example, as shown in FIG. 1, in some embodiments, the shift register unit comprises the first output sub-circuit 50 and the second output sub-circuit 60. As another example, as shown in FIG. 2, the shift register unit comprises the first output sub-circuit 50, the second output sub-circuit 60, and the third output sub-circuit 70; or the shift register unit comprises the first output sub-circuit 50 and the third output sub-circuit 70; or the shift register unit comprises the second output sub-circuit 60 and the third output sub-circuit 70.

In addition, the shift register unit further comprises a front-end circuit 01 coupled to a signal input terminal GSTV, a first clock signal terminal GCK, a second clock signal terminal GCB, a first voltage terminal VGL, a second voltage terminal VGH, and a signal output terminal Gout. The front-end circuit 01 is configured to receive a voltage at the signal input terminal GSTV, and output a voltage at the second clock signal terminal GCB or a voltage at the second voltage terminal VGH to the signal output terminal Gout under the control of the first clock signal terminal GCK and the second clock signal terminal GCB.

Here, the front-end circuit 01 comprises a pull-up control sub-circuit 10, a pull-down control sub-circuit 20, a pull-up sub-circuit 30, and a pull-down sub-circuit 40, as shown in FIG. 1.

Based thereon, the pull-up control sub-circuit 10 is coupled to the signal input terminal GSTV, the first clock signal terminal GCK, and a pull-up node PU. The pull-up control sub-circuit 10 is configured to output the voltage at the signal input terminal GSTV to the pull-up node PU under the control of the first clock signal terminal GCK.

The pull-up sub-circuit 30 is coupled to the second clock signal terminal GCB, the pull-up node PU, and the signal output terminal Gout. The pull-up sub-circuit 30 is configured to output the voltage at the second clock signal terminal GCB to the signal output terminal Gout under the control of the pull-up node PU.

The pull-down control sub-circuit 20 is coupled to the first clock signal terminal GCK, the first voltage terminal VGL, the pull-up node PU, and a pull-down node PD. The pull-down control sub-circuit 20 is configured to transfer voltages at the first voltage terminal VGL and the first clock signal terminal GCK to the pull-down node PD under the control of the first clock signal terminal GCK and the pull-up node PU.

The pull-down sub-circuit 40 is coupled to the pull-down node PD, the second voltage terminal VGH, and the signal output terminal Gout. The pull-down sub-circuit 40 is configured to transfer the voltage at the second voltage terminal VGH to the signal output terminal Gout under the control of the pull-down node PD.

The first output sub-circuit 50 is coupled to a third clock signal terminal GCK1, the second voltage terminal VGH, the signal output terminal Gout, and a reset signal output terminal OUT_RST. The first output sub-circuit 50 is configured to output a voltage at the signal output terminal Gout to the reset signal output terminal OUT_RST under the control of the third clock signal terminal GCK1. In some embodiments, in a case where the shift register unit comprises the second output sub-circuit 60, the first output sub-circuit 50 is further coupled to a gating signal output terminal OUT_Gate, and is further configured to output the voltage at the second voltage terminal VGH to the gating signal output terminal OUT_Gate.

The second output sub-circuit 60 is coupled to a fourth clock signal terminal GCB1, the second voltage terminal VGH, the signal output terminal Gout, and the gating signal output terminal OUT_Gate. The second output sub-circuit 60 is configured to output the voltage at the signal output terminal Gout to the gating signal output terminal OUT_Gate under the control of the fourth clock signal terminal GCB1. In some embodiments, in a case where the shift register unit comprises the first output sub-circuit 50, the second output sub-circuit 60 is further coupled to the reset signal output terminal OUT_RST, and is further configured to output the voltage at the second voltage terminal VGH to the reset signal output terminal OUT_RST.

In some embodiments, in a case where the shift register unit comprises the third output sub-circuit 70, the third output sub-circuit 70 is coupled to the first voltage terminal VGL, the signal output terminal Gout, the second voltage terminal VGH, and a light-emitting control signal output terminal OUT_EMS. The third output sub-circuit 70 is configured to output the voltage at the second voltage terminal VGH to the light-emitting control signal output terminal OUT_EMS under the control of the signal output terminal Gout; or the third output sub-circuit 70 is configured to output the voltage at the first voltage terminal VGL to the light-emitting control signal output terminal OUT_EMS under the control of the first voltage terminal VGL.

Figure 3A:
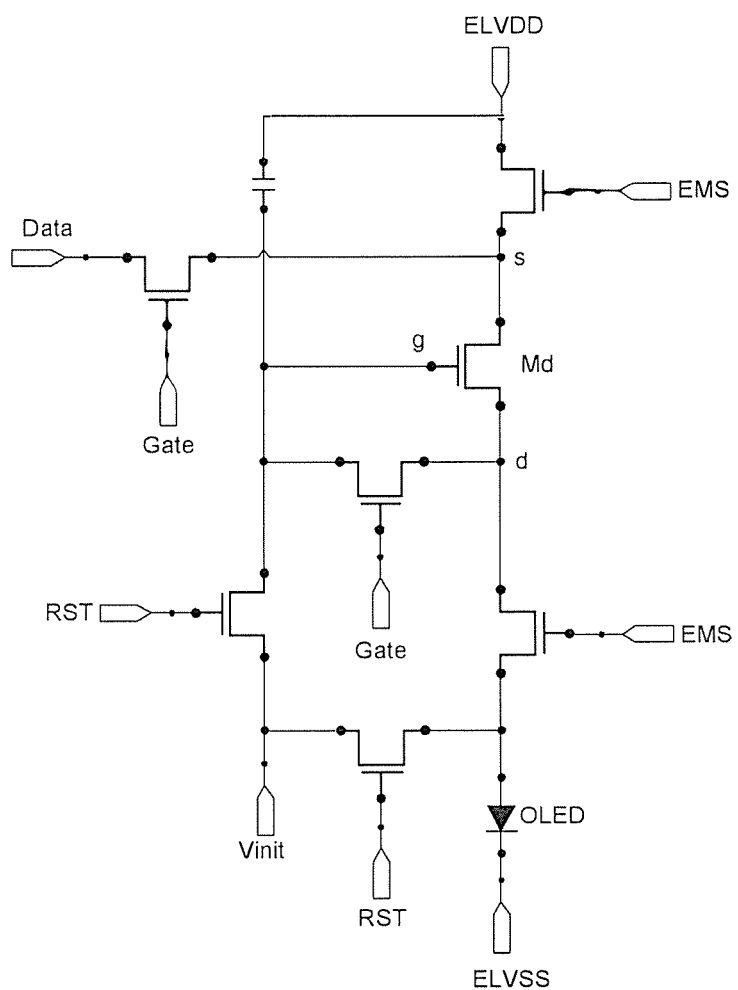
FIG. 3a is a structural diagram of an OLED pixel circuit coupled to the shift register unit shown in FIG. 1 or FIG. 2 according to an embodiment of the present application.

FIG. 3a illustrates a pixel driving circuit for driving an OLED pixel circuit to emit light, wherein the pixel circuit has 7T1C architecture, comprising a reset signal terminal RST, a gating signal terminal Gate, and a light-emitting control signal terminal EMS.

Figure 3B:
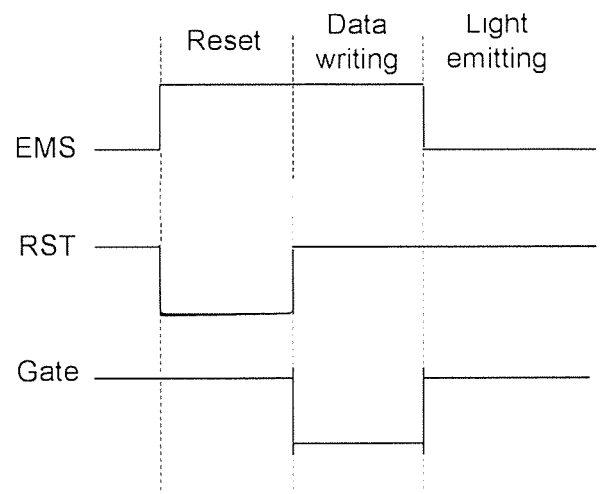

In the related art, for a display panel comprising a pixel driving circuit, three different driving circuits need to be provided in a non-display area to provide signals to three signal terminals respectively. The present embodiment is described by taking transistors of a pixel circuit being all P-type transistors as an example. Here, a timing diagram of the reset signal terminal RST, the gating signal terminal Gate, and the light-emitting control signal terminal EMS are shown in FIG. 3b. Specifically, in a reset phase, the reset signal terminal RST provides a low level to reset a gate g of a driving transistor Md and an anode of the OLED; in a data writing phase, the gating signal terminal Gate provides a low level to write a data voltage Vdata to a drain d of the driving transistor Md through a source s of the driving transistor Md; and in a light-emitting phase, the light-emitting control signal terminal EMS provides a low level to control the OLED to emit light.

In some embodiments, the shift register unit according to the present application comprises at least two sub-circuits of the first output sub-circuit 50, the second output sub-circuit 60, and the third output sub-circuit 70, wherein the reset signal output terminal OUT_RST coupled to the first output sub-circuit 50 may be coupled to the reset signal terminal RST to provide a signal to the reset signal terminal RST; the gating signal output terminal OUT_Gate coupled to the second output sub-circuit 60 may be coupled to the gating signal terminal Gate to provide a signal to the gating signal terminal Gate; and the light-emitting control signal output terminal OUT_EMS coupled to the third output sub-circuit 70 may be coupled to the light-emitting control signal terminal EMS to provide a signal to the light-emitting control signal terminal EMS.

In some embodiments, the first output sub-circuit 50, the second output sub-circuit 60, and the third output sub-circuit 70 are all coupled to the signal output terminal Gout. In some embodiments, the first output sub-circuit 50 may select a part of a signal output at the signal output terminal Gout as a reset signal, which is output to the reset signal terminal RST of the OLED pixel circuit through the reset signal output terminal OUT_RST; the second output sub-circuit 60 may select another part of the signal output at the signal output terminal Gout as a gating signal, which is output to the gating signal terminal Gate of the OLED pixel circuit through the gating signal output terminal OUT_Gate; and the third output sub-circuit 70 may determine a timing of a light-emitting control signal under the control of the signal output at the signal output terminal Gout, and the timing is output to the light-emitting control signal terminal EMS of the OLED pixel circuit through the light-emitting control signal output terminal OUT_EMS. In this way, the gate driving circuit formed by shift register units may at least provide signals to at least two signal terminals (at least two of the reset signal terminal RST, the gating signal terminal Gate, and the light-emitting control signal terminal EMS) of one pixel circuit, so that a number of gate driving circuits in the non-display area can be reduced, thereby achieving the purpose of improving the wiring space and realizing the narrow bezel.

Figure 4:
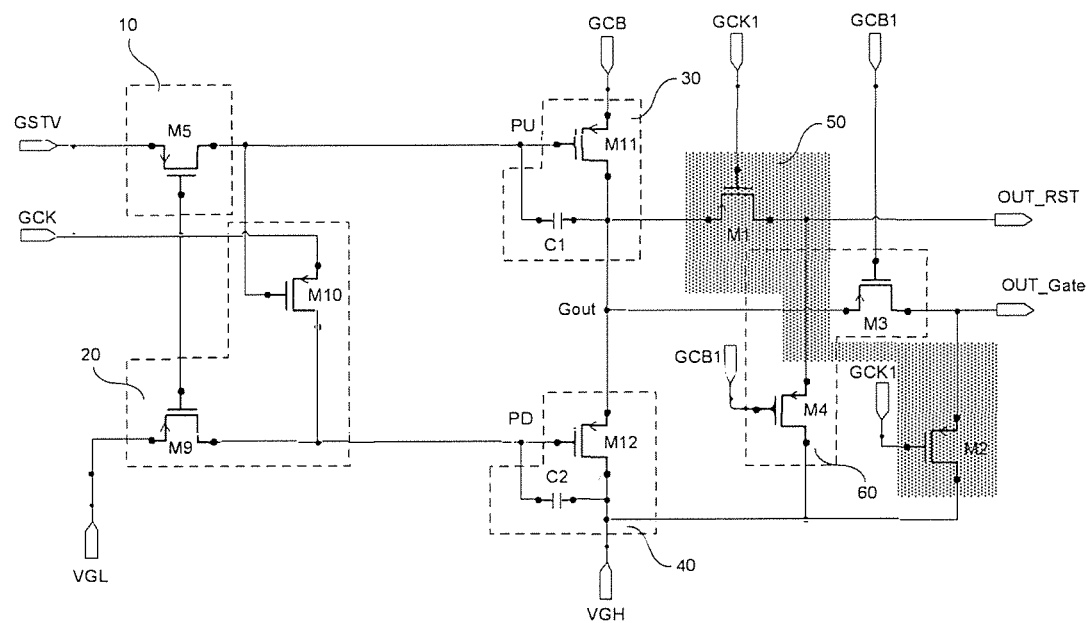
FIG. 4 is a specific structural diagram of various sub-circuits in FIG. 1.

Specifically, as shown in FIG. 4, in some embodiments, the first output sub-circuit 50 comprises a first transistor M1 and a second transistor M2.

Here, the first transistor M1 has a gate coupled to the third clock signal terminal GCK1, a first electrode coupled to the signal output terminal Gout, and a second electrode coupled to the reset signal output terminal OUT_RST.

The second transistor M2 has a gate coupled to the third clock signal terminal GCK1, a first electrode coupled to the gating signal output terminal OUT_Gate, and a second electrode coupled to the second voltage terminal VGH.

In some embodiments, the second output sub-circuit 60 comprises a third transistor M3 and a fourth transistor M4.

Here, the third transistor M3 has a gate coupled to the fourth clock signal terminal GCB1, a first electrode coupled to the signal output terminal Gout, and a second electrode coupled to the gating signal output terminal OUT_Gate.

The fourth transistor M4 has a gate coupled to the fourth clock signal terminal GCB1, a first electrode coupled to the reset signal output terminal OUT_RST, and a second electrode coupled to the second voltage terminal VGH.

Figure 5:
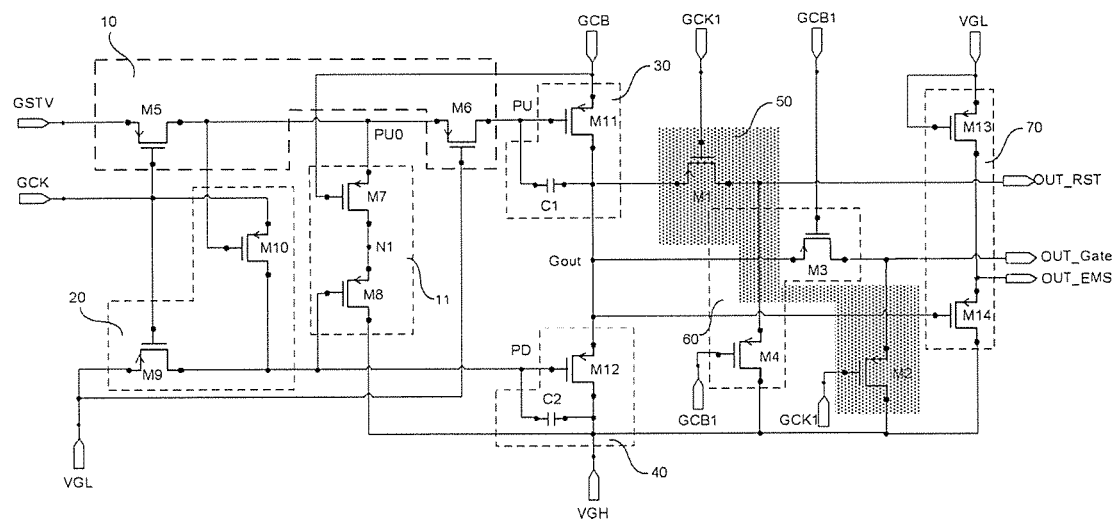
FIG. 5 is a specific structural diagram of various sub-circuits in FIG. 2.

In some embodiments, in a case where the shift register unit comprises the third output sub-circuit 70, the third output sub-circuit 70 comprises a thirteenth transistor M13 and a fourteenth transistor M14, as shown in FIG. 5.

Here, the thirteenth transistor M13 has a gate and a first electrode coupled to the first voltage terminal VGL, and a second electrode coupled to the light-emitting control signal output terminal OUT_EMS.

The fourteenth transistor M14 has a gate coupled to the signal output terminal Gout, a first electrode coupled to the light-emitting control signal output terminal OUT_EMS, and a second electrode coupled to the second voltage terminal VGH.

Here, the fourteenth transistor M14 has a width to length ratio greater than that of the thirteenth transistor M13. In this case, the fourteenth transistor M14 has a driving capability greater than that of the thirteenth transistor M13. In this case, when both the thirteenth transistor M13 and the fourteenth transistor M14 are turned on, the potential at the light-emitting control signal output terminal OUT_EMS depends on a voltage potential at the second voltage terminal VGH which is transferred through the fourteenth transistor M14.

Based thereon, the pull-up control sub-circuit 10 comprises a fifth transistor M5. Here, the fifth transistor M5 has a gate coupled to the first clock signal terminal GCK, a first electrode coupled to the signal input terminal GSTV, and a second electrode coupled to the pull-up node PU.

Based thereon, in some embodiments, the shift register unit may further comprise a voltage holding sub-circuit 11, as shown in FIG. 5. The voltage holding sub-circuit 11 is coupled to the pull-down node PD, the second electrode of the fifth transistor M5, the second clock signal terminal GCB, and the second voltage terminal VGH. Here, the voltage holding sub-circuit 11 is configured to store the voltage output at the second voltage terminal VGH and output the stored voltage to the second electrode of the fifth transistor M5 under the control of the second clock signal terminal GCB and the pull-down node PD. Thereby, in a case where the fifth transistor M5 is coupled to the pull-up node PU, the voltage at the second voltage terminal VGH may be output to the pull-up node PU through the voltage holding sub-circuit 11 to stabilize the potential at the pull-up node PU.

Specifically, in some embodiments, the voltage holding sub-circuit 11 comprises a seventh transistor M7 and an eighth transistor M8.

Here, the seventh transistor M7 has a gate coupled to the second clock signal terminal GCB, a first electrode coupled to the second electrode of the fifth transistor M5, and a second electrode coupled to a first electrode of the eighth transistor M8.

The eighth transistor M8 has a gate coupled to the pull-down node PD, and a second electrode coupled to the second voltage terminal VGH.

In some embodiments, the pull-up control sub-circuit 10 is further coupled to the first voltage terminal VGL. In this case, the pull-up control sub-circuit 10 further comprises a sixth transistor M6.

Here, the sixth transistor M6 has a gate coupled to the first voltage terminal VGL, a first electrode coupled to the second electrode of the fifth transistor M5, and a second electrode coupled to the pull-up node PU. In this case, when the sixth transistor M6 is turned on, the second electrode of the fifth transistor M5 may be coupled to the pull-up node PU through the sixth transistor M6. In this way, in a case where the sixth transistor M6 is a P-type transistor, when the voltage at the second electrode of the sixth transistor M6 is greater than the voltage at the gate of the sixth transistor M6, the sixth transistor M6 may be in a turn-off state, thereby preventing electric leakage from occurring at the pull-up node PU.

In some embodiments, the pull-down control sub-circuit 20 comprises a ninth transistor M9 and a tenth transistor M10.

Here, the ninth transistor M9 has a gate coupled to the first clock signal terminal GCK, a first electrode coupled to the first voltage terminal VGL, and a second electrode coupled to the pull-down node PD.

The tenth transistor M10 has a gate coupled to the pull-up node PU, a first electrode coupled to the first clock signal terminal GCK, and a second electrode coupled to the pull-down node PD.

In some embodiments, the pull-up sub-circuit 30 comprises an eleventh transistor M11 and a first capacitor C1.

Here, the eleventh transistor M11 has a gate coupled to the pull-up node PU, a first electrode coupled to the second clock signal terminal GCB, and a second electrode coupled to the signal output terminal Gout.

The first capacitor C1 has one terminal coupled to the gate of the eleventh transistor M11, and the other terminal coupled to the second electrode of the eleventh transistor M11.

The pull-down sub-circuit 40 comprises a twelfth transistor M12 and a second capacitor C2.

Here, the twelfth transistor M12 has a gate coupled to the pull-down node PD, a first electrode coupled to the signal output terminal Gout, and a second electrode coupled to the second voltage terminal VGH.

The second capacitor C2 has one terminal coupled to the gate of the twelfth transistor M12, and the other terminal coupled to the second electrode of the twelfth transistor M12.

It should be illustrated that in some embodiments, the transistor may be an N-type transistor or a P-type transistor. Here, a first electrode of the transistor may be a source, and a second electrode of the transistor may be a drain, or optionally, the first electrode of the transistor may be a drain, and the second electrode of the transistor may be a source, which is not limited in the present application.

The present application is described by taking the first voltage terminal VGL outputting a constant low level and the second voltage terminal VGH outputting a constant high level as an example.

Hereinafter, operating conditions of the shift register unit shown in FIG. 5 in various phases in one frame of image will be described in detail by taking the transistors in the shift register unit and the transistors in the OLED pixel circuit which are coupled to the reset signal terminal RST, the gating signal terminal Gate, and the light-emitting control signal terminal EMS being all P-type transistors as an example, in combination with a signal timing diagram shown in FIG. 6.

Figure 6:
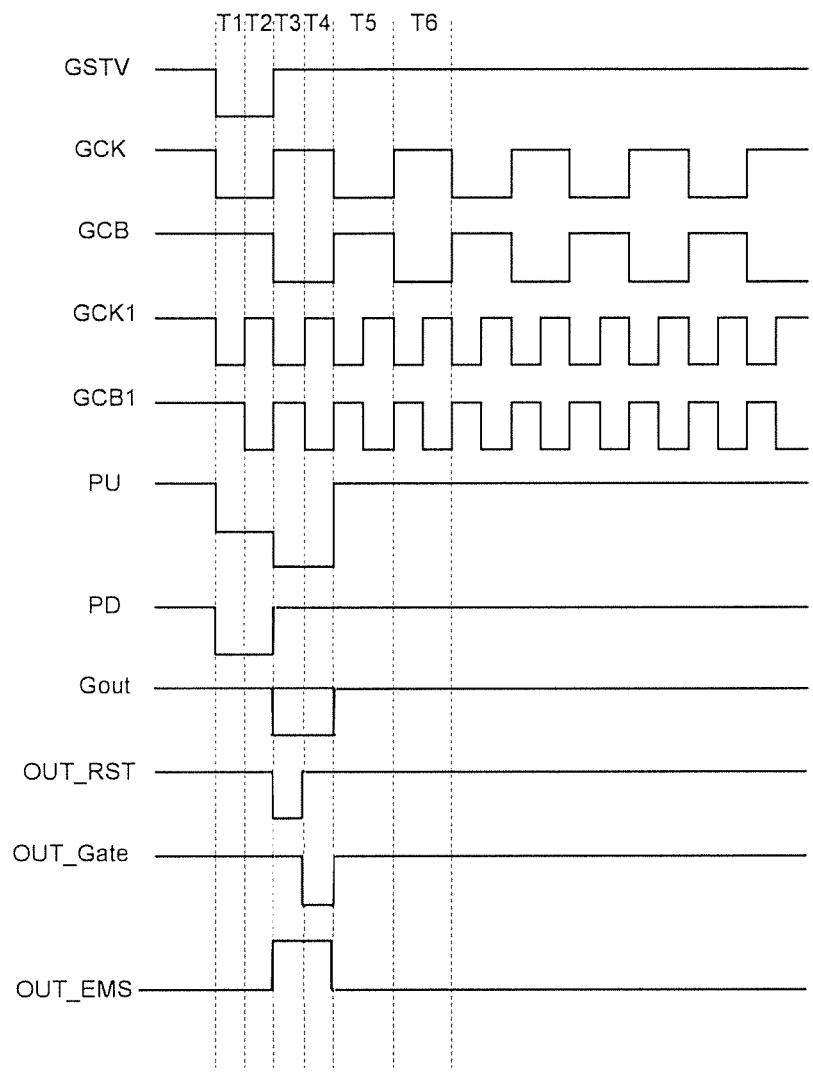
FIG. 6 is a timing diagram of various signals for controlling the shift register unit shown in FIG. 5.

Here, as shown in FIG. 6, signals output at the first clock signal terminal GCK and the second clock signal terminal GCB have the same frequency and opposite phases; signals output at the third clock signal terminal GCK1 and the fourth clock signal terminal GCB1 have the same frequency and opposite phases; and a frequency of the signal output at the first clock signal terminal GCK is ½ of a frequency of the signal output at the third clock signal terminal GCK1.

In some embodiments, a first phase T1, a second phase T2, a third phase T3 and a fourth phase T4 have the same duration in one frame of image. A fifth phase P5 and a sixth phase P6 have duration twice the duration of the fourth phase T4.

Specifically, in the first phase T1, GSTV=0; GCK=0; GCB=1; GCK1=0; and GCB1=1, wherein "0" indicates a high level and "1" indicates a low level.

Figure 7:
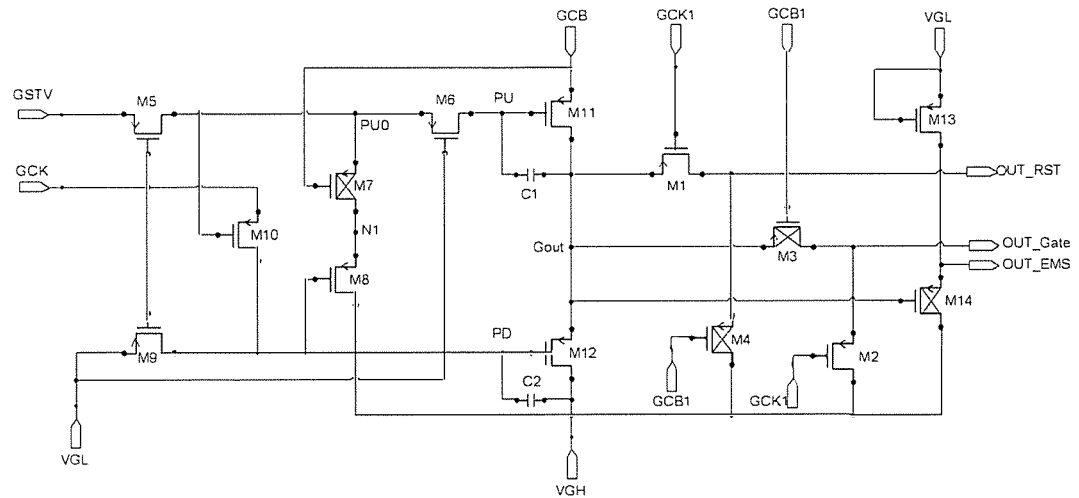
FIG. 7, FIG. 8, FIG. 9, FIG. 10, FIG. 11, and FIG. 12 are operating diagrams of the shift register unit shown in FIG. 5 in a first phase T1, a second phase T2, a third phase T3, a fourth phase T4, a fifth phase P5, and a sixth phase P6 shown in FIG. 6 respectively.

In this case, as shown in FIG. 7, the first clock signal terminal GCK outputs a low level, and the fifth transistor M5 and the ninth transistor M9 are turned on. The low level output at the signal input terminal GSTV is transferred to a node PU0 through the fifth transistor M5, and is then transferred to the pull-up node PU through the turned-on sixth transistor M6. The tenth transistor M10 is turned on under the control of the node PU0. The low level output at the first voltage terminal VGL is transferred to the pull-down node PD through the ninth transistor M9, and the low level output at the first clock signal terminal GCK is transferred to the pull-down node PD through the tenth transistor M10.

In some embodiments, the eighth transistor M8 is turned on, the seventh transistor M7 is turned off, and the high level output at the second voltage terminal VGH is transferred through the eighth transistor M8, and may then be stored in parasitic capacitance GS formed by the gate and the source of the seventh transistor M7 and parasitic capacitance GD formed by the gate and the drain of the eighth transistor M8, that is, in some embodiments, the high level is stored at the node N1.

The eleventh transistor M11 is turned on under the control of the pull-up node PU, to transfer the high level output at the second clock signal terminal GCB to the signal output terminal Gout. The twelfth transistor M12 is turned on under the control of the pull-down node PD, to transfer the high level output at the second voltage terminal VGH to the signal output terminal Gout.

The first transistor M1 and the second transistor M2 are turned on under the control of the third clock signal terminal GCK1. The high level at the signal output terminal Gout is transferred to the reset signal output terminal OUT_RST through the first transistor M1. The high level at the second voltage terminal VGH is transferred to the gating signal output terminal OUT_Gate through the second transistor M2.

The third transistor M3, the fourth transistor M4, and the fourteenth transistor M14 are in a turn-off state. The thirteenth transistor M13 is turned on, to transmit the low level at the first voltage terminal VGL to the light-emitting control signal output terminal OUT_EMS through the thirteenth transistor M13.

In this phase, the reset signal output terminal OUT_RST outputs a high level, and thereby the reset signal terminal RST of the OLED pixel circuit which is coupled to the shift register unit receives the high level. Therefore, transistors in the OLED pixel circuit which are coupled to the reset signal terminal RST are turned off, and thus the OLED pixel circuit does not enter a reset phase.

In the second phase T2, GSTV=0; GCK=0; GCB=1; GCK1=1; and GCB1=0.

Figure 8:
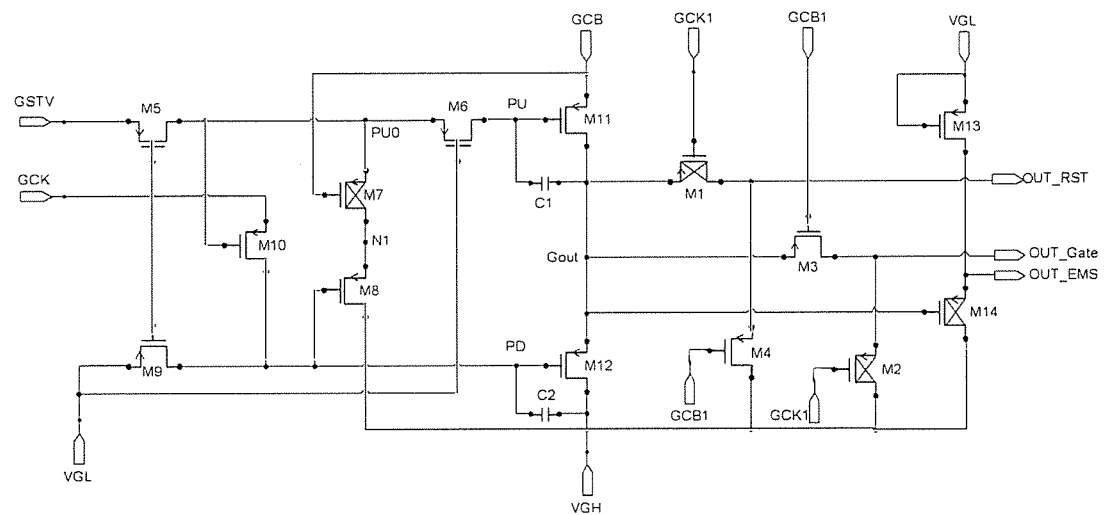

In this case, as shown in FIG. 8, the signals output at the signal input terminal GSTV, the first clock signal terminal GCK, and the second clock signal terminal GCB are the same as those in the first phase T1. The difference is that the third clock signal terminal GCK1 outputs a high level, and the fourth clock signal terminal GCB1 outputs a low level. Therefore, in this phase, the first transistor M1 and the second transistor M2 are turned off, the third transistor M3 and the fourth transistor M4 are turned on, and turn-on states and turn-off states of remaining transistors are the same as those in the first phase T1.

Based thereon, the high level at the signal output terminal Gout may be transferred to the gating signal output terminal OUT_Gate through the third transistor M3; the high level at the second voltage terminal VGH may be transferred to the reset signal output terminal OUT_RST through the fourth transistor M4; and the light-emitting control signal output terminal OUT_EMS continue to output a low level.

As described above, in this phase, the OLED pixel circuit coupled to the shift register unit does not enter the reset phase either.

In the third phase T3, GSTV=1; GCK=1; GCB=0; GCK1=0; and GCB1=1.

Figure 9:
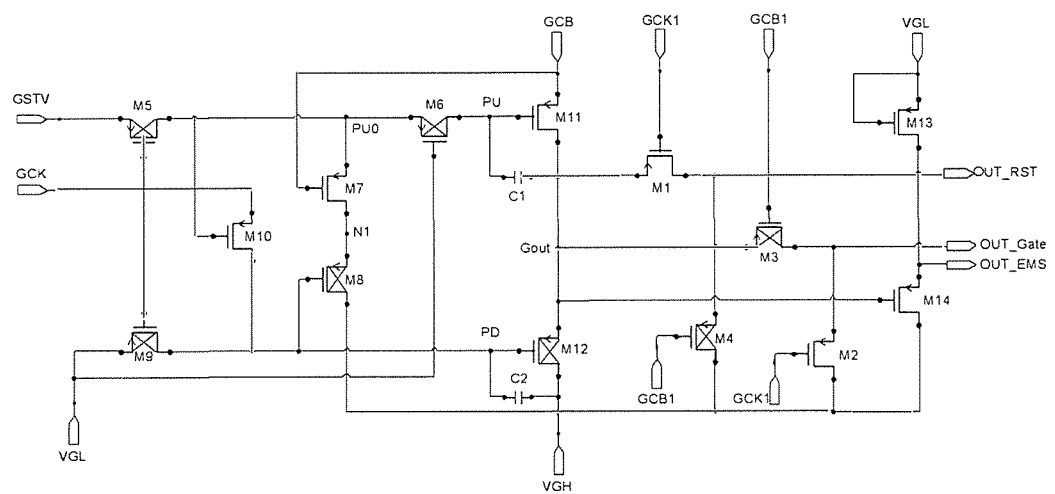

In this case, as shown in FIG. 9, the first clock signal terminal GCK outputs a high level, and the fifth transistor M5 and the ninth transistor M9 are turned off. The level at the pull-up node PU is further reduced under the bootstrapping action of the first capacitor C1. In this case, the eleventh transistor M11 is maintained to be in a turn-on state, and outputs the low level at the second clock signal terminal GCB to the signal output terminal Gout.

The tenth transistor M10 is turned on under the control of the pull-up node PU to transfer the high level output at the first clock signal terminal GCK to the pull-down node PD. In this case, the eighth transistor M8 and the twelfth transistor M12 are turned off.

In some embodiments, as the sixth transistor M6 is a P-type transistor, a level at a terminal coupled to the first electrode of the sixth transistor M6 (i.e., a terminal coupled to the pull-up node PU) is further reduced in this phase, a voltage at the source (or the drain) of the sixth transistor M6 is greater than a voltage at the gate of the sixth transistor M6, and the sixth transistor M6 is in a turn-off state.

It should be illustrated that in this phase, the node PU0 is at a low level since in the second phase T2, the low level output at the signal input terminal GSTV is stored in parasitic capacitance formed by the gate and the active layer in the tenth transistor M10. The parasitic capacitance of the tenth transistor M10 is greater than the parasitic capacitance GS of the seventh transistor M7 and the parasitic capacitance GD of the eighth transistor M8 at the node N1, and therefore in the second phase, a capability of the parasitic capacitance of the tenth transistor M10 to maintain the node PU0 to be at a low level is greater than a capability of the parasitic capacitance at the node N1 to write a high level to the node PU0.

Based thereon, the third clock signal terminal GCK1 outputs a low level, and the first transistor M1 and the second transistor M2 are turned on. The fourth clock signal terminal GCB1 outputs a high level, and the third transistor M3 and the fourth transistor M4 are turned off. The level at the signal output terminal Gout may be transferred to the reset signal output terminal OUT_RST through the first transistor M1, and the high level at the second voltage terminal VGH may be transferred to the gating signal output terminal OUT_Gate through the second transistor M2.

In some embodiments, the fourteenth transistor M14 is turned on. As the driving capability of the fourteenth transistor M14 is greater than that of the thirteenth transistor M13, the fourteenth transistor M14 may transfer the high level at the second voltage terminal VGH to the light-emitting control signal output terminal OUT_EMS.

It can be seen that the reset signal output terminal OUT_RST outputs a low level, and the gating signal output terminal OUT_Gate and the light-emitting control signal output terminal OUT_EMS output a high level. In this case, the reset signal terminal RST of the OLED pixel circuit which is coupled to the shift register unit receives the low level, thereby resetting voltages at corresponding positions (for example, the gate of the driving transistor, the anode of the OLED, etc.) in the OLED pixel circuit. In this case, the OLED pixel circuit is in the reset phase.

In the fourth phase T4, GSTV=1; GCK=1; GCB=0; GCK1=1; and GCB=0.

Figure 10:
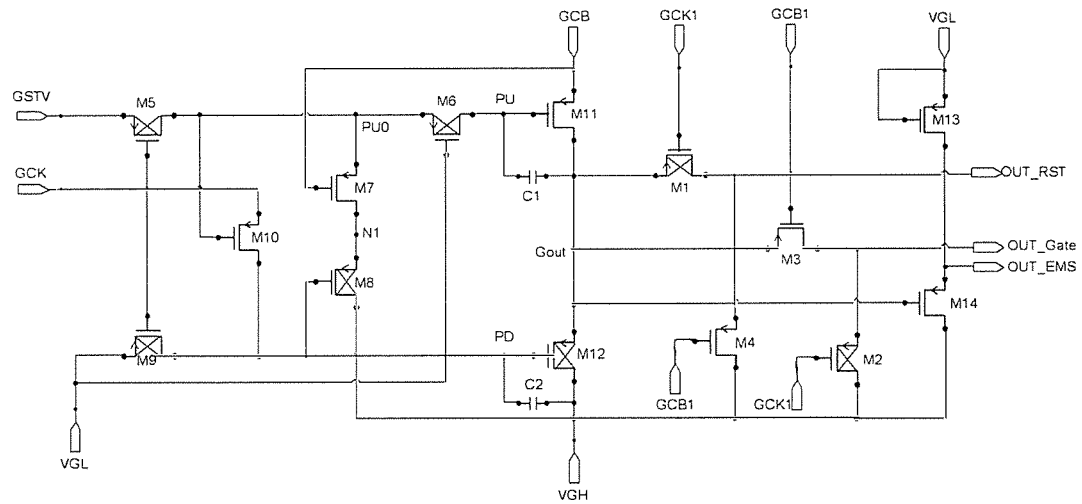

In this case, as shown in FIG. 10, the signals output at the signal input terminal GSTV, the first clock signal terminal GCK, and the second clock signal terminal GCB are the same as those in the third phase T3. The difference is that the third clock signal terminal GCK1 outputs a high level, and the fourth clock signal terminal GCB1 outputs a low level. Therefore, in this phase, the first transistor M1 and the second transistor M2 are turned off, the third transistor M3 and the fourth transistor M4 are turned on, and turn-on states and turn-off states of remaining transistors are the same as those in the third phase T3.

Based thereon, in some embodiments, the low level at the signal output terminal Gout may be transferred to the gating signal output terminal OUT_Gate through the third transistor M3; the high level at the second voltage terminal VGH may be transferred to the reset signal output terminal OUT_RST through the fourth transistor M4; and the light-emitting control signal output terminal OUT_EMS continues to output a high level.

In some embodiments, the gating signal output terminal OUT_Gate outputs a low level, and the reset signal output terminal OUT_RST and the light-emitting control signal output terminal OUT_EMS output a high level. In this case, the gating signal terminal Gate of the OLED pixel circuit which is coupled to the shift register unit receives the low level, thereby writing a data voltage Data to the driving transistor. In this case, the OLED pixel circuit is in a data writing phase.

In the fifth phase P5, GSTV=1; GCK=0; GCB=1; GCK1=0 or 1; and GCB1=1 or 0.

Figure 11:
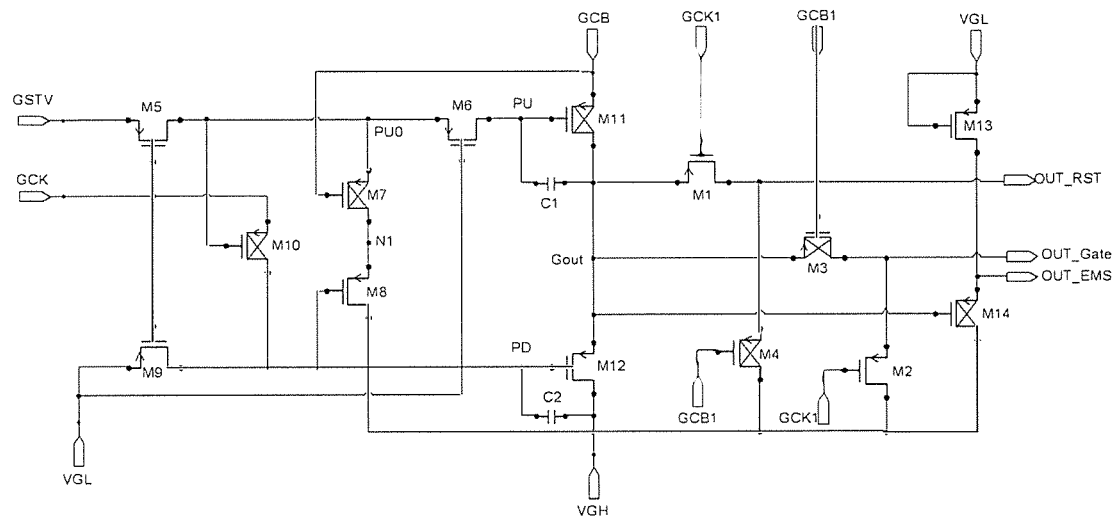

In this case, as shown in FIG. 11, the fifth transistor M5 and the ninth transistor M9 are turned on under the control of the low level output at the first clock signal terminal GCK, to transfer the high level at the signal input terminal GSTV to the pull-up node PU, and thereby the eleventh transistor M11 and the tenth transistor M10 are turned off.

The low level at the first voltage terminal VGL is transferred to the pull-down node PD through the ninth transistor M9, the twelfth transistor M12 is turned on, and the eighth transistor M8 is turned on. The voltage at the second voltage terminal VGH is transferred to the signal output terminal Gout through the twelfth transistor M12, and is stored at the first node N1 through the eighth transistor M8. The seventh transistor M7 is turned off under the control of the second clock signal terminal GCB.

In the fifth phase P5, the third clock signal terminal GCK1 sequentially outputs a low level and a high level, and the fourth clock signal terminal GCB2 sequentially outputs a high level and a low level. Based thereon, when the third clock signal terminal GCK1 outputs a low level and the fourth clock signal terminal GCB1 outputs a high level, as shown in FIG. 11, the first transistor M1 and the second transistor M2 are turned on, and the third transistor M3 and the fourth transistors M4 are turned off. When the third clock signal terminal GCK1 outputs a high level and the fourth clock signal terminal GCB1 outputs a low level, the first transistor M1 and the second transistor M2 are turned off, and the third transistor M3 and the fourth transistor M4 are turned on. Regardless of the signal output at the third clock signal terminal GCK1 or the fourth clock signal terminal GCB1, as the signal output terminal Gout is at a high level, the gating signal output terminal OUT_Gate and the reset signal output terminal OUT_RST output a high level.

In some embodiments, the fourteenth transistor M14 is turned off under the control of the signal output terminal Gout, and therefore the thirteenth transistor M13 transfers the low level at the first voltage terminal VGL to the light-emitting control signal output terminal OUT_EMS. In this case, the light-emitting control signal terminal EMS of the OLED pixel circuit which is coupled to the shift register unit receives the low level, thereby controlling the OLED to emit light. In this case, the OLED pixel circuit is in a light-emitting phase.

In the sixth phase P6, GSTV=1; GCK=1; GCB=0; GCK1=0 or 1; and GCB1=1 or 0.

Figure 12:
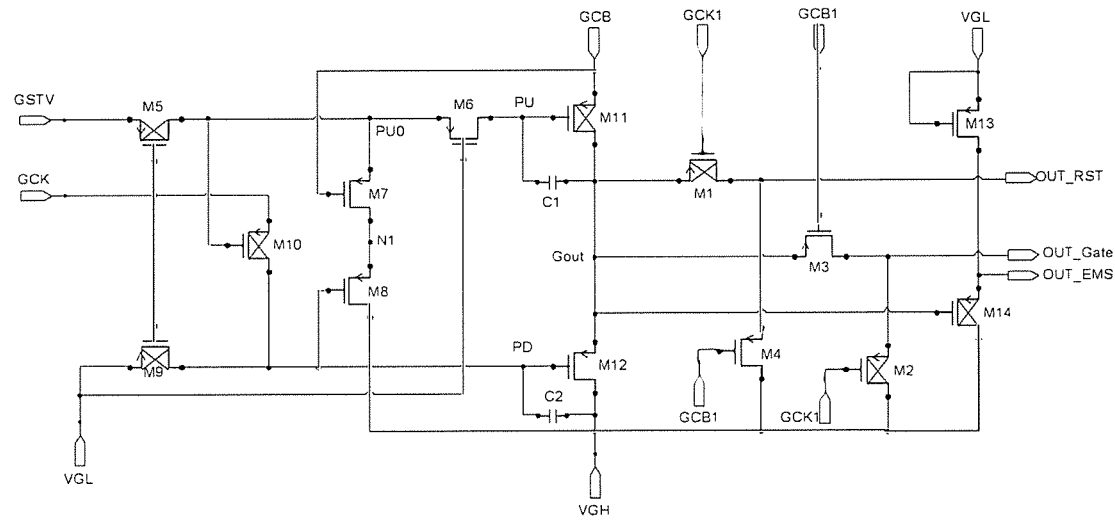

In this case, as shown in FIG. 12, the fifth transistor M5 and the ninth transistor M9 are turned off under the control of the high level output at the first clock signal terminal GCK. The pull-down control node PD is maintained at the low level from a previous phase under the discharging action of the second capacitor C2. In this case, the twelfth transistor M12 and the eighth transistor M8 are turned on. The seventh transistor M7 is turned on under the control of the low level at the second clock signal terminal GCB, to transfer the high level at the node N1 to the node PU0 and the pull-up node PU, and thereby the eleventh transistor M11 and the tenth transistor M10 are turned off.

In some embodiments, the high level at the second voltage terminal VGH is transferred to the signal output terminal Gout through the twelfth transistor M12, and the signal output terminal Gout continues to output a high level. In this case, the light-emitting control signal output terminal OUT_EMS outputs a low level.

Based thereon, the signals output at the third clock signal terminal GCK1 and the fourth clock signal terminal GCB2 are the same as those in the fifth phase, and therefore the gating signal output terminal OUT_Gate and the reset signal output terminal OUT_RST continue to output a high level.

It should be illustrated that the shift register unit repeats the fifth phase and the sixth phase after the sixth phase T2 until the start of a next frame of image.

The above is a description made by taking all the transistors in the shift register unit and the transistors in the OLED pixel circuit which are coupled to the reset signal terminal RST, the gating signal terminal Gate, and the light-emitting control signal terminal EMS being P-type transistors as an example. When the transistors in the shift register unit and the transistors in the OLED pixel circuit which are coupled to the reset signal terminal RST, the gating signal terminal Gate, and the light-emitting control signal terminal EMS are all N-type transistors, some of the control signals in FIG. 6 need to be reversed in terms of phase, and positions of the first voltage terminal VGL and the second voltage terminal VGH need to be exchanged. An operating process of the shift register unit may be derived similarly, and details thereof are not described here again.

Figure 13:
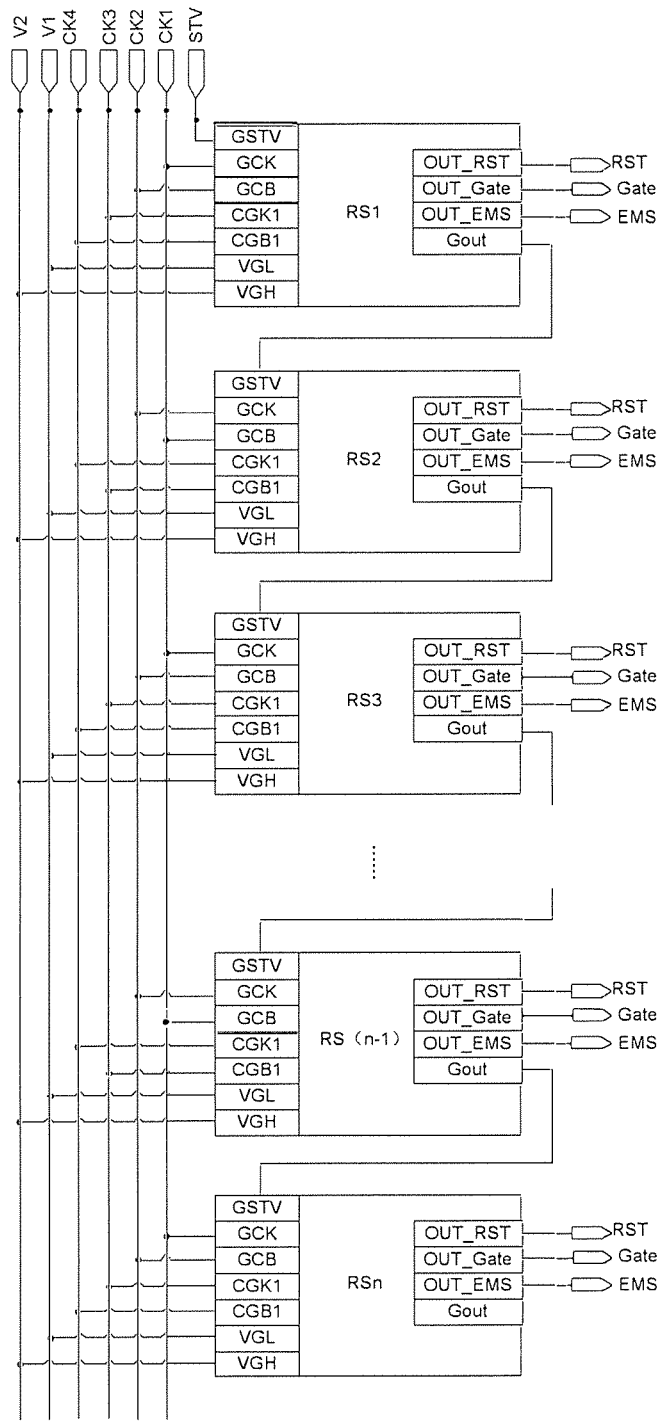
FIG. 13 is a structural diagram of a gate driving circuit according to the present application.

The embodiments of the present application provide a gate driving circuit. As shown in FIG. 13, the gate driving circuit comprises a plurality of cascaded shift register units as described above.

Here, a signal input terminal GSTV of a shift register unit RS1 at the first stage is coupled to a start signal terminal STV. After the start signal terminal STV inputs a start signal, the shift register unit starts operating.

For other shift register units than the shift register unit RS1 at the first stage, the signal output terminal Gout of the shift register unit at a stage is coupled to the signal input terminal GSTV of the shift register unit at the next stage.

It should be illustrated that a first clock signal terminal GCK and a second clock signal terminal GCB of two adjacent shift register units are alternately coupled to system clock signal terminals CK1 and CK2, respectively. For example, the first clock signal terminal GCK of the shift register unit RS1 at the first stage is coupled to the system clock signal terminal CK1, and a second clock signal terminal GCB of the shift register unit RS1 at the first stage is coupled to the system clock signal terminal CK2; and the first clock signal terminal GCK of the shift register unit RS2 at the second stage is coupled to the system clock signal terminal CK2, and the second clock signal terminal GCB of the shift register unit RS2 at the second stage is coupled to the system clock signal terminal CK1.

In some embodiments, a third clock signal terminal GCK1 and a fourth clock signal terminal GCB1 of two adjacent shift register units are alternately coupled to system clock signal terminals CK3 and CK4, respectively. For example, the third clock signal terminal GCK1 of the shift register unit RS1 at the first stage is coupled to the system clock signal terminal CK3, and the fourth clock signal terminal GCB1 of the shift register unit RS1 at the first stage is coupled to the system clock signal terminal CK4; and the third clock signal terminal GCK1 of the shift register unit RS2 at the second stage is coupled to the system clock signal terminal CK4, and the fourth clock signal terminal GCB1 of the shift register unit RS2 at the second stage is coupled to the system clock signal terminal CK3. Connection manners of clock signal terminals of remaining shift register units are similar to those described above.

In some embodiments, the gate driving circuit has the same technical effects as those of the shift register unit according to the above embodiments, and details thereof are not described here again.

The embodiments of the present application provide a display apparatus comprising any of the gate driving circuits described above. The gate driving circuit in the display apparatus has the same structure and advantageous effects as those of the gate driving circuit according to the above embodiments. As the structure and advantageous effects of the gate driving circuit have been described in detail in the above embodiments, details thereof are not described here again.

It should be illustrated that, in the embodiments of the present disclosure, the display apparatus may specifically be at least an organic light-emitting diode display apparatus, for example, the display apparatus may be any product or component having a display function such as a display, a television, a digital photo frame, a mobile phone, a vehicle-mounted display screen, or a tablet computer etc.

The embodiments of the present application provide a method for driving any of the shift register units described above. In one frame of image, in a case where the front-end circuit 01 of the shift register unit comprises the pull-up control sub-circuit 10, the pull-down control sub-circuit 20, the pull-up sub-circuit 30, and the pull-down sub-circuit 40, the method comprises: in the first phase T1 and the second phase T2 shown in FIG. 6, outputting, by the pull-up control sub-circuit 10 in FIG. 2, the voltage at the signal input terminal GSTV to the pull-up node PU under the control of the first clock signal terminal GCK; outputting, by the pull-up sub-circuit 30, the voltage at the second clock signal terminal GCB to the signal output terminal Gout under the control of the pull-up node PU; transferring, by the pull-down control sub-circuit 20, the voltages at the first voltage terminal VGL and the first clock signal terminal GCK to the pull-down node PD under the control of the first clock signal terminal GCK and the pull-up node PU; and transferring, by the pull-down sub-circuit 40, the voltage at the second voltage terminal VGH to the signal output terminal Gout under the control of the pull-down node PU.

In a case where the shift register unit comprises the third output sub-circuit 70, the third output sub-circuit 70 outputs the voltage at the first voltage terminal VGL to the light-emitting control signal output terminal OUT_EMS under the control of the first voltage terminal VGL.

In some embodiments, in the third phase T3 and the fourth phase T4, the method comprises: outputting, by the pull-up sub-circuit 30, the voltage at the second clock signal terminal GCB to the signal output terminal Gout under the control of the pull-up node PU; transferring, by the pull-down control sub-circuit 20, the voltage at the first clock signal terminal GCK to the pull-down node PD under the control of the pull-up node PU; and entering, by the pull-down sub-circuit 40, a turn-off state under the control of the pull-down node PD.

In a case where the shift register unit comprises the third output sub-circuit 70, the third output sub-circuit 70 outputs the voltage at the second voltage terminal VGH to the light-emitting control signal output terminal OUT_EMS under the control of the signal output terminal Gout.

In some embodiments, in a case where the shift register unit comprises the first output sub-circuit 50 and the second output sub-circuit 60, in the first phase T1 and the third phase T3, the first output sub-circuit 50 outputs the voltage at the signal output terminal Gout to the reset signal output terminal OUT_RST and outputs the voltage at the second voltage terminal VGH to the gating signal output terminal OUT_Gate under the control of the third clock signal terminal GCK1.

In the second phase T2 and the fourth phase T4, the second output sub-circuit 20 outputs the voltage at the signal output terminal Gout to the gating signal output terminal OUT_Gate and outputs the voltage at the second voltage terminal VGH to the reset signal output terminal OUT_RST under the control of the fourth clock signal terminal GCB1.

In the fifth phase P5, the pull-down control sub-circuit 20 transfers the voltage at the first voltage terminal VGL to the pull-down node PD under the control of the first clock signal terminal GCK.

The pull-down sub-circuit 40 transfers the voltage at the second voltage terminal VGH to the signal output terminal Gout under the control of the pull-down node PD.

In a case where the pull-up control sub-circuit 10 comprises the voltage holding sub-circuit 11, in the fifth phase P5, the voltage holding sub-circuit 11 stores the voltage output at the second voltage terminal VGH under the control of the second clock signal terminal CGB and the pull-down node PD.

In the sixth phase P6, the pull-down sub-circuit 40 continuously transfers the voltage at the second voltage terminal VGH to the signal output terminal Gout.

In a case where the pull-up control sub-circuit 10 comprises the voltage holding sub-circuit 11, in the sixth phase P6, the voltage holding sub-circuit 11 outputs the stored voltage to the pull-up node PU under the control of the second clock signal terminal CGB and the pull-down node PD.

In some embodiments, in the fifth phase P5 and the sixth phase P6, the first output sub-circuit 50 and the second output sub-circuit 60 alternately output the voltage at the signal output terminal Gout to the reset signal output terminal OUT_RST and the gating signal output terminal OUT_Gate, respectively.

In a case where the shift register unit comprises the third output sub-circuit 70, the third output sub-circuit 70 outputs the voltage at the first voltage terminal VGL to the light-emitting control signal output terminal OUT_EMS under the control of the first voltage terminal VGL.

Based thereon, the fifth phase P5 and the sixth phase P6 are repeated after the sixth phase P6 until the start of a next frame of image.

When the various sub-circuits as shown in FIG. 5 are used, turn-on states and turn-off states of various transistors in the shift register unit in various phases of one frame of image are as described above, and details thereof are not described here again. In some embodiments, the driving method has the same technical effects as those of the shift register unit according to the above embodiments, and details thereof are not described here again.

The embodiments of the present application provide a shift register unit and a method for driving the same, a gate driving circuit, and a display apparatus. The shift register unit according to the present application comprises at least two sub-circuits of the first output sub-circuit, the second output sub-circuit, and the third output sub-circuit, wherein the reset signal output terminal of the first output sub-circuit may be coupled to the reset signal terminal in the OLED pixel circuit to provide a signal to the reset signal terminal; the gating signal output terminal coupled to the second output sub-circuit may be coupled to the gating signal terminal in the OLED pixel circuit to provide a signal to the gating signal terminal; and the light-emitting control signal output terminal coupled to the third output sub-circuit may be coupled to the light-emitting control signal terminal in the OLED pixel circuit to provide a signal to the light-emitting control signal terminal. In this way, the gate driving circuit formed by the shift register units can provide signals to at least two signal terminals (at least two of the reset signal terminal, the gating signal terminal, and the light-emitting control signal terminal) of at least one pixel circuit, so that a number of gate driving circuits provided in the non-display area can be reduced, thereby achieving the purpose of improving the wiring space and realizing the narrow bezel.

Therefore, with the shift register unit and the method for driving the same, the gate driving circuit, and the display apparatus according to the embodiments of the present disclosure, the problem that the non-display area has a small wiring space since each of a plurality of different signal terminals of the OLED pixel circuit corresponds to one driving circuit can be at least partially solved or mitigated.

It can be understood by those of ordinary skill in the art that all or part of the steps of implementing the method embodiments in the present specification can be completed by programs instructing related hardware, and the above programs can be stored in a computer readable storage medium. The programs, when executed, implement the steps of the method embodiments included in some embodiments; and the above storage medium comprises various media which can store program codes, such as a Read-Only Memory (ROM), a Random Access Memory (RAM), a magnetic disk, or an optical disk etc.

The above description is only specific embodiments of the present disclosure, but the protection scope of the present disclosure is not limited thereto. Changes or substitutions which can be easily reached by any skilled in the art within the technical scope of the present disclosure should be covered within the protection scope of the present disclosure. Therefore, the protection scope of the present disclosure should be determined by the protection scope of the claims.

We claim:

1. A shift register unit comprising at least two sub-circuits of a first output sub-circuit, a second output sub-circuit, and a third output sub-circuit, wherein the shift register unit further comprises a front-end circuit, wherein the front-end circuit is coupled to a signal input terminal, a first clock signal terminal, a second clock signal terminal, a first voltage terminal, a second voltage terminal, and a signal output terminal, and is configured to receive a voltage at the signal input terminal, and output a voltage at the second clock signal terminal or a voltage at the second voltage terminal to the signal output terminal under the control of the first clock signal terminal and the second clock signal terminal, wherein the first output sub-circuit is coupled to a third clock signal terminal, the second voltage terminal, the signal output terminal, a reset signal output terminal, and a gating signal output terminal, and is configured to output a voltage at the signal output terminal to the reset signal output terminal and output the voltage at the second voltage terminal to the gating signal output terminal under the control of the third clock signal terminal, wherein the second output sub-circuit is coupled to a fourth clock signal terminal, the second voltage terminal, the signal output terminal, the reset signal output terminal, and the gating signal output terminal, and is configured to output the voltage at the signal output terminal to the gating signal output terminal and output the voltage at the second voltage terminal to the reset signal output terminal under the control of the fourth clock signal terminal, wherein the third output sub-circuit is coupled to the first voltage terminal, the signal output terminal, the second voltage terminal, and a light-emitting control signal output terminal, and is configured to output the voltage at the second voltage terminal to the light-emitting control signal output terminal under the control of the signal output terminal, or is configured to output a voltage at the first voltage terminal to the light-emitting control signal output terminal under the control of the first voltage terminal, wherein the reset signal output terminal is electrically coupled to each of one or more pixels and configured to supply a reset signal to the one or more pixels, wherein the gating signal output terminal is electrically coupled to each of the one or more pixels and configured to supply a gating signal to the one or more pixels, and wherein the light-emitting control signal output terminal is electrically coupled to each of the one or more pixels and configured to supply a light-emitting signal to the one or more pixels.

2. The shift register unit according to claim 1, wherein the first output sub-circuit comprises a first transistor and a second transistor, wherein the first transistor has a gate coupled to the third clock signal terminal, a first electrode coupled to the signal output terminal, and a second electrode coupled to the reset signal output terminal; and wherein the second transistor has a gate coupled to the third clock signal terminal, a first electrode coupled to the gating signal output terminal, and a second electrode coupled to the second voltage terminal.

3. The shift register unit according to claim 1, wherein the second output sub-circuit comprises a third transistor and a fourth transistor, wherein the third transistor has a gate coupled to the fourth clock signal terminal, a first electrode coupled to the signal output terminal, and a second electrode coupled to the gating signal output terminal; and wherein the fourth transistor has a gate coupled to the fourth clock signal terminal, a first electrode coupled to the reset signal output terminal, and a second electrode coupled to the second voltage terminal.

4. The shift register unit according to claim 1, wherein the third output sub-circuit comprises a thirteenth transistor and a fourteenth transistor, wherein the thirteenth transistor has a gate and a first electrode coupled to the first voltage terminal, and a second electrode coupled to the light-emitting control signal output terminal; and wherein the fourteenth transistor has a gate coupled to the signal output terminal, a first electrode coupled to the light-emitting control signal output terminal, and a second electrode coupled to the second voltage terminal, wherein the fourteenth transistor has a width to length ratio greater than that of the thirteenth transistor.

5. The shift register unit according to claim 1, wherein the front-end circuit comprises a pull-up control sub-circuit, a pull-down control sub-circuit, a pull-up sub-circuit, and a pull-down sub-circuit, wherein the pull-up control sub-circuit is coupled to the signal input terminal, the first clock signal terminal, and a pull-up node, and is configured to output the voltage at the signal input terminal output to the pull-up node under the control of the first clock signal terminal;

wherein the pull-up sub-circuit is coupled to the second clock signal terminal, the pull-up node, and the signal output terminal, and is configured to output the voltage at the second clock signal terminal to the signal output terminal under the control of the pull-up node;

wherein the pull-down control sub-circuit is coupled to the first clock signal terminal, the first voltage terminal, the pull-up node, and a pull-down node, and is configured to transfer voltages at the first voltage terminal and the first clock signal terminal to the pull-down node under the control of the first clock signal terminal and the pull-up node; and wherein the pull-down sub-circuit is coupled to the pull-down node, the second voltage terminal, and the signal output terminal, and is configured to transfer the voltage at the second voltage terminal to the signal output terminal under the control of the pull-down node.

6. The shift register unit according to claim 5, wherein the pull-up control sub-circuit comprises a fifth transistor, wherein the fifth transistor has a gate coupled to the first clock signal terminal, a first electrode coupled to the signal input terminal, and a second electrode coupled to the pull-up node.

7. The shift register unit according to claim 6, wherein the pull-up control sub-circuit is further coupled to the first voltage terminal, and the pull-up control sub-circuit further comprises a sixth transistor, wherein the sixth transistor has a gate coupled to the first voltage terminal, a first electrode coupled to the second electrode of the fifth transistor, and a second electrode coupled to the pull-up node.

8. The shift register unit according to claim 6, wherein the shift register unit further comprises a voltage holding sub-circuit, wherein the voltage holding sub-circuit is coupled to the pull-down node, the second electrode of the fifth transistor, the second clock signal terminal, and the second voltage terminal, and is configured to store the voltage output at the second voltage terminal and output the stored voltage to the second electrode of the fifth transistor under the control of the second clock signal terminal and the pull-down node.

9. The shift register unit according to claim 8, wherein the voltage holding sub-circuit comprises a seventh transistor and an eighth transistor, wherein the seventh transistor has a gate coupled to the second clock signal terminal, a first electrode coupled to the second electrode of the fifth transistor, and a second electrode coupled to a first electrode of the eighth transistor; and wherein the eighth transistor has a gate coupled to the pull-down node, and a second electrode coupled to the second voltage terminal.

10. The shift register unit according to claim 5, wherein the pull-down control sub-circuit comprises a ninth transistor and a tenth transistor, wherein the ninth transistor has a gate coupled to the first clock signal terminal, a first electrode coupled to the first voltage terminal, and a second electrode coupled to the pull-down node; and wherein the tenth transistor has a gate coupled to the pull-up node, a first electrode coupled to the first clock signal terminal, and a second electrode coupled to the pull-down node.

11. The shift register unit according to claim 5, wherein the pull-up sub-circuit comprises an eleventh transistor and a first capacitor, wherein the eleventh transistor has a gate coupled to the pull-up node, a first electrode coupled to the second clock signal terminal, and a second electrode coupled to the signal output terminal; and wherein the first capacitor has one terminal coupled to the gate of the eleventh transistor, and the other terminal coupled to the second electrode of the eleventh transistor.

12. The shift register unit according to claim 5, wherein the pull-down sub-circuit comprises a twelfth transistor and a second capacitor, wherein the twelfth transistor has a gate coupled to the pull-down node, a first electrode coupled to the signal output terminal, and a second electrode coupled to the second voltage terminal; and wherein the second capacitor has one terminal coupled to the gate of the twelfth transistor, and the other terminal coupled to the second electrode of the twelfth transistor.

13. A gate driving circuit comprising a plurality of cascaded shift register units according to claim 1, wherein the signal input terminal of the shift register unit at the first stage is coupled to a start signal terminal; and wherein for other shift register units than the shift register unit at the first stage, the signal output terminal of the shift register unit at a stage is coupled to the signal input terminal of the shift register unit at the next stage.

14. A display apparatus comprising the gate driving circuit according to claim 13.

15. A method for driving the shift register unit, wherein the shift register unit comprises at least two sub-circuits of a first output sub-circuit, a second output sub-circuit, and a third output sub-circuit, wherein the shift register unit further comprises a front-end circuit, wherein the front-end circuit is coupled to a signal input terminal, a first clock signal terminal, a second clock signal terminal, a first voltage terminal, a second voltage terminal, and a signal output terminal, and is configured to receive a voltage at the signal input terminal, and output a voltage at the second clock signal terminal or a voltage at the second voltage terminal to the signal output terminal under the control of the first clock signal terminal and the second clock signal terminal, wherein the first output sub-circuit is coupled to a third clock signal terminal, the second voltage terminal, the signal output terminal, a reset signal output terminal, and a gating signal output terminal, and is configured to output a voltage at the signal output terminal to the reset signal output terminal and output the voltage at the second voltage terminal to the gating signal output terminal under the control of the third clock signal terminal, wherein the second output sub-circuit is coupled to a fourth clock signal terminal, the second voltage terminal, the signal output terminal, the reset signal output terminal, and the gating signal output terminal, and is configured to output the voltage at the signal output terminal to the gating signal output terminal and output the voltage at the second voltage terminal to the reset signal output terminal under the control of the fourth clock signal terminal, wherein the third output sub-circuit is coupled to the first voltage terminal, the signal output terminal, the second voltage terminal, and a light-emitting control signal output terminal, and is configured to output the voltage at the second voltage terminal to the light-emitting control signal output terminal under the control of the signal output terminal, or is configured to output a voltage at the first voltage terminal to the light-emitting control signal output terminal under the control of the first voltage terminal, wherein the reset signal output terminal is electrically coupled to each of one or more pixels and configured to supply a reset signal to the one or more pixels, wherein the gating signal output terminal is electrically coupled to each of the one or more pixels and configured to supply a gating signal to the one or more pixels, wherein the light-emitting control signal output terminal is electrically coupled to each of the one or more pixels and configured to supply a light-emitting signal to the one or more pixels, and wherein in a case where the front-end circuit of the shift register unit comprises a pull-up control sub-circuit, a pull-down control sub-circuit, a pull-up sub-circuit, and a pull-down sub-circuit, the method comprises, in one frame of image:

in a first phase and a second phase, outputting, by the pull-up control sub-circuit, a voltage at the signal input terminal to the pull-up node under the control of the first clock signal terminal; outputting, by the pull-up sub-circuit, a voltage at the second clock signal terminal to the signal output terminal under the control of the pull-up node; transferring, by the pull-down control sub-circuit, voltages at the first voltage terminal and the first clock signal terminal to the pull-down node under the control of the first clock signal terminal and the pull-up node; transferring, by the pull-down sub-circuit, a voltage at the second voltage terminal to the signal output terminal under the control of the pull-down node; and outputting, by the third output sub-circuit, a voltage at the first voltage terminal to the light-emitting control signal output terminal under the control of the first voltage terminal;

in a third phase and a fourth phase, outputting, by the pull-up sub-circuit, the voltage at the second clock signal terminal to the signal output terminal under the control of the pull-up node; transferring, by the pull-down control sub-circuit, a voltage at the first clock signal terminal to the pull-down node under the control of the pull-up node; entering, by the pull-down sub-circuit, a turn-off state under the control of the pull-down node; and outputting, by the third output sub-circuit, the voltage at the second voltage terminal to the light-emitting control signal output terminal under the control of the signal output terminal; and in the first phase and the third phase, outputting, by the first output sub-circuit, a voltage at the signal output terminal to the reset signal output terminal and outputting the voltage at the second voltage terminal to the gating signal output terminal under the control of the third clock signal terminal;

in the second phase and the fourth phase, outputting, by the second output sub-circuit, the voltage at the signal output terminal to the gating signal output terminal and outputting the voltage at the second voltage terminal to the reset signal output terminal under the control of the fourth clock signal terminal; and in a fifth phase, transferring, by the pull-down control sub-circuit, the voltage at the first voltage terminal to the pull-down node under the control of the first clock signal terminal, and transferring, by the pull-down sub-circuit, the voltage at the second voltage terminal to the signal output terminal under the control of the pull-down node;

in a sixth phase, continuously transferring, by the pull-down sub-circuit, the voltage at the second voltage terminal to the signal output terminal; and in the fifth phase and the sixth phase, alternately outputting, by the first output sub-circuit and the second output sub-circuit, the voltage at the signal output terminal to the reset signal output terminal and the gating signal output terminal, respectively; and outputting, by the third output sub-circuit, the voltage at the first voltage terminal to the light-emitting control signal output terminal under the control of the first voltage terminal.

16. The method according to claim 15, further comprising:

repeating the fifth phase and the sixth phase after the sixth phase until a start of a next frame of image, wherein the first phase, the second phase, the third phase, and the fourth phase have the same duration, and the fifth phase and the sixth phase have a duration twice the duration of the fourth phase.

17. The method according to claim 15, wherein in a case where the pull-up control sub-circuit comprises a voltage holding sub-circuit, the method comprises:

in the fifth phase, storing, by the voltage holding sub-circuit, the voltage output at the second voltage terminal under the control of the second clock signal terminal and the pull-down node; and in the sixth phase, outputting, by the voltage holding sub-circuit, the stored voltage to the pull-up node under the control of the second clock signal terminal and the pull-down node.

18. The method according to claim 15, wherein signals output at the first clock signal terminal and the second clock signal terminal have the same frequency and opposite phases;

signals output at the third clock signal terminal and the fourth clock signal terminal have the same frequency and opposite phases; and a frequency of the signal output at the first clock signal terminal is ½ of a frequency of the signal output at the third clock signal terminal.

\* \* \* \* \*